United States Patent [19]

Tanimoto

[11] Patent Number: 5,093,661
[45] Date of Patent: Mar. 3, 1992

[54] RESISTIVE STRING TYPE DIGITAL-TO-ANALOG CONVERTING UNIT

[75] Inventor: Susumu Tanimoto, Tokyo, Japan
[73] Assignee: NEC Corporation, Tokyo, Japan
[21] Appl. No.: 652,885
[22] Filed: Feb. 8, 1991
[30] Foreign Application Priority Data
Feb. 9, 1990 [JP] Japan ................................. 2-31116
[51] Int. Cl.⁵ ............................................. H03M 1/78
[52] U.S. Cl. ...................................... 341/144; 341/154
[58] Field of Search .............. 341/144, 148, 153, 154, 341/136, 118, 121; 307/491

[56] References Cited

U.S. PATENT DOCUMENTS

| | | | |
|---|---|---|---|
| 4,352,092 | 9/1982 | Masuda et al. | 341/136 |
| 4,713,649 | 12/1987 | Hino | 341/133 |
| 4,800,365 | 1/1989 | White et al. | 341/119 |
| 4,942,397 | 7/1990 | Real | 341/118 |

*Primary Examiner*—A. D. Pellinen
*Assistant Examiner*—Brian K. Young
*Attorney, Agent, or Firm*—Helfgott & Karas

[57] ABSTRACT

A digital-to-analog converting unit fabricated on a single semiconductor chip comprises a string of resistive elements coupled between a source of power voltage level and a source of ground voltage level and an array of switching elements respectively associated with intermediate nodes each provided between every adjacent two resistive elements, and each of the switching elements is implemented by a parallel combination of an n-channel type component field effect transistor and a p-channel type component field effect transistor even if one of the component field effect transistors of the switching elements near the voltage sources remains off at all times, because the parallel combinations enhances uniformity of pattern on the semiconductor chip, thereby preventing the string of the resistive elements from irregularity of sheet resistance.

7 Claims, 13 Drawing Sheets

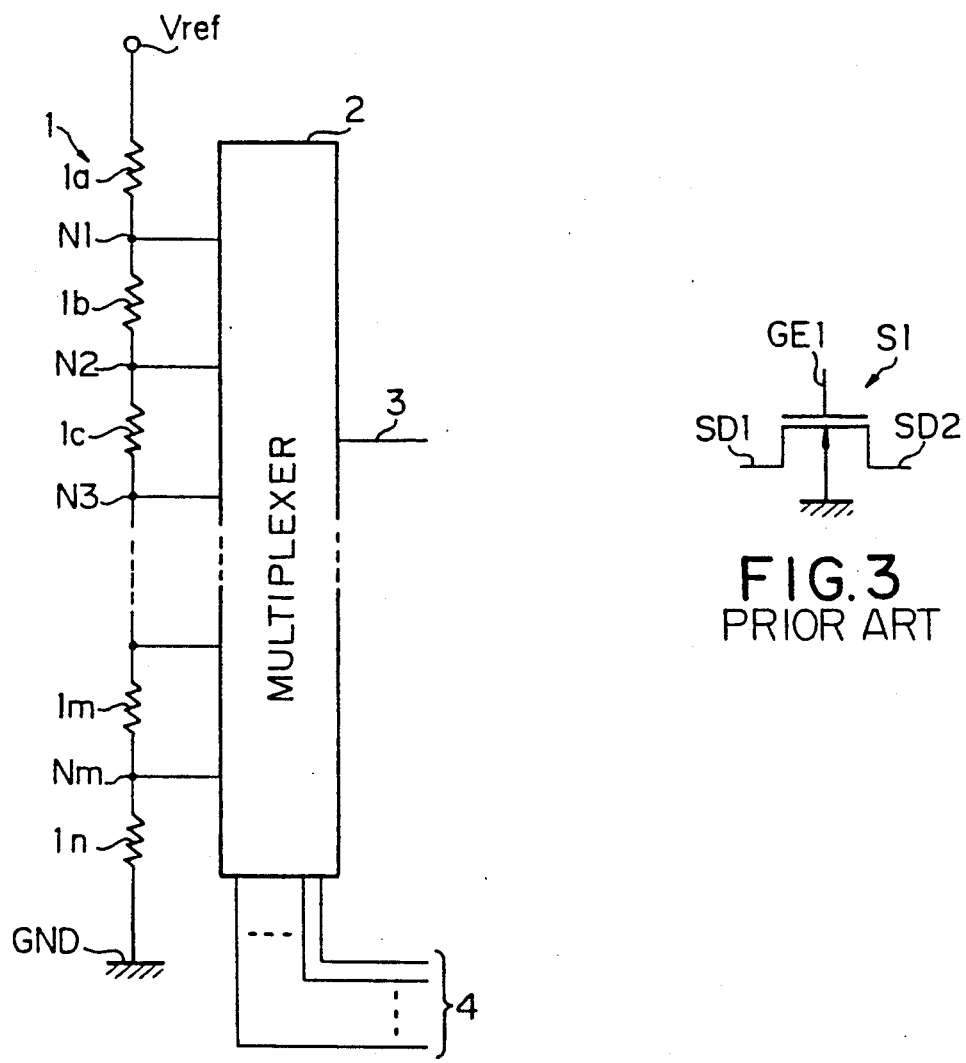
FIG.1 PRIOR ART
FIG.3 PRIOR ART
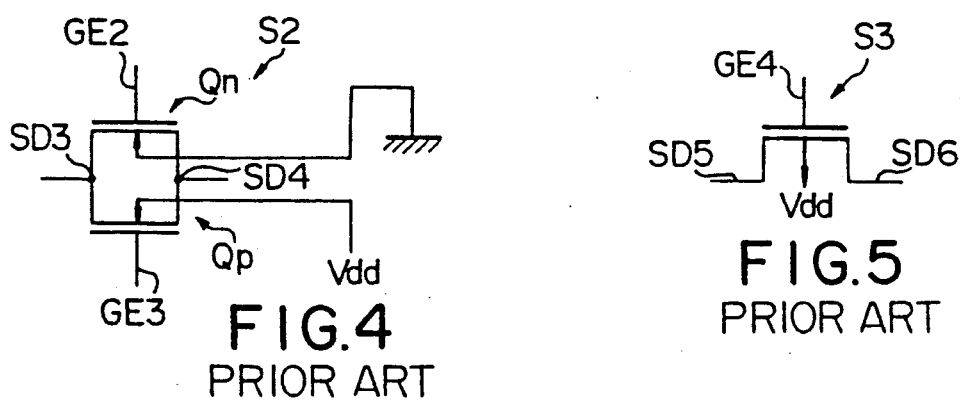
FIG.4 PRIOR ART
FIG.5 PRIOR ART

RESISTIVE STRING TYPE DIGITAL-TO-ANALOG CONVERTING UNIT

FIELD OF THE INVENTION

This invention relates to a digital-to-analog converting unit and, more particularly, to a resistor string type digital-to-analog converter.

DESCRIPTION OF THE RELATED ART

A typical example of the resistor string type digital-to-analog converter is shown in FIG. 1 of the drawings, but the digital-to-analog converter shown in FIG. 1 is simplified for better understanding. The digital-to-analog converter largely comprises a resistor string 1 and a multiplexer 2, and the resistor string 1 is implemented by a plurality of resistive elements 1a, 1b, 1c, . . . , 1m and 1n coupled in series between a reference voltage terminal Vref and a ground terminal GND. The number of the resistive, elements 1a to 1n depends on the resolution of the digital-to-analog converter. Each of the resistive elements 1b to 1m is adjusted to a unit resistance of R. On the other hand, the resistive elements 1a and 1n are different in resistance from the other resistive elements 1b to 1m so as to minimize the quantization error. The multiplexer 2 is implemented by a switching network coupled between current supply nodes N1, N2, N3, . . . and Nm and an output signal line 3. The switching network is responsive to a multi-bit digital signal on input signal lines 4, and the component switching elements of the switching network selectively turn on and off so that the voltage level at one of the nodes N1 to Nm is outputted through the switching elements of on-state to the line 3 as the converted analog voltage level.

It is important for each of the resistive elements 1a to 1n to have a high relative accuracy to other resistive elements. For this reason, all of the resistive elements 1a to 1n are usually similar in configuration to one another and arranged as close as possible. In a fabrication process of the digital-to-analog converting unit, the resistive elements 1a to 1n are implemented by impurity regions concurrently formed in the semiconductor substrate together with heavily doped source and drain regions of component MOS field effect transistors. This is because of the fact that the heavily doped impurity regions thus formed are less liable to fluctuate in resistivity. In other words, the process achieves a good reproducibility.

FIG. 2 shows the circuit arrangement of a part of a prior art digital-to-analog converter. A plurality of resistive elements are coupled in series between a power source node Vdd and a ground node GND. Each of the resistive elements with a half of the unit resistance R is labeled with "R/2", and the resistor element with the unit resistance R is accompanied with "R". However, each of the resistive elements sandwiched between the resistive elements "R" is not labeled with any mark for the sake of simplicity and is as large in resistance as the resistor element "R". The resistive elements are associated with a switching network which is implemented by three kinds of switching element. The first switching element is formed only of an n-channel enhancement type MOS field effect transistor S1 shown in FIG. 3, and a conductive path is established between nodes SD1 and SD2 in the presence of a positive high voltage level at the gate electrode GE1 thereof. The n-channel enhancement type MOS field effect transistors S1 are arranged into two rows and are associated with the input signal lines X1 and X2, respectively. The n-channel enhancement type MOS field effect transistors S1 are coupled at the gate electrodes thereof GE1 to the associated input signal lines X1 and X2, and the nodes SD1 are coupled to nodes between the adjacent resistive elements. The other nodes SD2 are coupled to output signal lines O1 to O8, and the two rows of the n-channel enhancement type MOS field effect transistors S1 are concurrently gated by the input signal lines X1 and X2, respectively. The second switching element is fabricated from both of an n-channel enhancement type MOS field effect transistor Qn and a p-channel enhancement type MOS field effect transistor Qp which are coupled in parallel as shown in FIG. 4. For this reason, the second switching element is referred to as "parallel combination" and labeled with S2. The parallel combination S2 provides a conduction path between common nodes SD3 and SD4 in the co-presence of the positive high voltage level at the gate electrode GE2 of the n-channel enhancement type MOS field effect transistor Qn and the ground level at the gate electrode GE3 of the p-channel enhancement type MOS field effect transistor Qp. The parallel combinations S2 are arranged into four rows and associated with the four input signal line pairs X3 and X6 to $\overline{X3}$ and $\overline{X6}$. The gate electrodes GE2 and GE3 are coupled to the true and complementary input signal lines, respectively, and the common node SD3 is coupled to the node between the adjacent resistive elements, as shown in FIG. 2. The output signal lines O1 to O8 are also associated to the parallel combinations S2, and the common nodes SD4 are coupled to the associated output signal lines O1 to O8. The third switching element is implemented only by a p-channel enhancement type MOS field effect transistor Q3 shown in FIG. 5, and the source/drain nodes and the gate electrode thereof are labeled with SD5, SD6 and GE4. The p-channel enhancement type MOS field effect transistors are arranged in two rows and associated with the input signal lines $\overline{X7}$ and $\overline{X8}$. The gate electrodes of the p-channel enhancement type MOS field effect transistors are coupled to the associated input signal lines $\overline{X7}$ and $\overline{X8}$, and conductive channels take place between the nodes between the adjacent resistive elements and the associated output signal lines O1 to O8 in the presence of the ground voltage level on the associated input signal lines $\overline{X7}$ and $\overline{X8}$. Thus, the switching network is controlled with the input signal lines X1 to X6 and $\overline{X3}$ to $\overline{X8}$.

The circuit arrangement shown in FIG. 2 is fabricated on a semiconductor chip 61, and the layout is illustrated in FIG. 6 in a composite manner. Although the circuit is formed in a multi-level structure, all of the regions and strips are drawn with real lines, and inter-level insulating films are omitted therefrom for the sake of clearness. However, since contact holes are marked with X in boxes or represented by small black areas, connections between different levels would be well understood.

The string of the resistive elements R and R/2 is implemented by a plurality of n-type impurity regions 62a, 62b, 62c, 62d, 62e, 62f, 62g and 62h arranged in parallel, and the any two n-type impurity regions 62a to 62h are coupled through a metal strip 63a, 63b, 63c, 63d, 63e, 63f or 63g. The n-type impurity region 62a is supplied from a metal strip 64a with the power voltage level, and the ground voltage level is fed from a metal strip 64b to the n-type impurity region 62h.

N-type wells 65a, 65b and 65c are formed in the semiconductor chip 61 between the n-type impurity regions 62a and 62b, 62c and 62d, and 62e and 62f, and p-channel enhancement type MOS field effect transistors S3 and Qp are formed in the n-type wells 65a to 65c. A plurality of n-type impurity regions are further formed in the semiconductor chip 61 between the n-type impurity regions 62c to 62f and the n-type wells 65a to 65c and between the n-type impurity regions 62g and 62h, and the n-type enhancement MOS field effect transistors S1 and Qn are fabricated from the plurality of n-type impurity regions. Though not shown in FIG. 6, a thick field oxide film is grown on the semiconductor chip 61 and provides electrical insulation between the impurity regions and the wells.

Each of the input signal lines X1 to X6 and X3 to X8 is implemented by a polysilicon strip, and the polysilicon strip further provides the gate electrodes GE1, GE2, GE3 or GE4. For example, the nodes SD1 and SD2 correspond to the n-type impurity regions, which are also labeled with SD1 and SD2 in FIG. 6, and the polysilicon strip X1 extends over that area between the n-type impurity regions SD1 and SD2, thereby providing the gate electrode GE1 of the n-channel enhancement type MOS field effect transistor S1. Similarly, the polysilicon strip X3 extends over that area between the n-type impurity regions SD3' and SD4' for providing the gate electrode GE2, and the polysilicon strip CX3 passes over that area between p-type impurity regions SD3" and SD4" for providing the gate electrode GE3. The n-type impurity region SD3' and the p-type impurity regions SD3" form in combination the common node SD3, and the common node SD4 is implemented by the n-type impurity region SD4' and the p-type impurity region SD4". P-type impurity regions SD5 and SD6 in the n-type well 65a are spaced from each other, and the polysilicon strip X8 provides the gate electrode GE4 of the p-channel enhancement type MOS field effect transistor S3.

Thin metal strips O1 to O8 serve as the output signal lines O1 to O8 and are selectively coupled to the n-type impurity regions SD2 and SD4' and the p-type impurity regions SD4" and SD6. Thus, the digital-to-analog converting unit is fabricated on the semiconductor chip 61, and the switching network is implemented by three kinds of switching element. The p-channel enhancement type MOS field effect transistors S3 are provided for the resistive elements closer to the metal strip 64a or the source of power voltage Vdd, and the n-channel enhancement type MOS field effect transistors S1 are associated with the resistive elements closer to the metal strip 64b or the source of ground voltage level. This is because of the fact that an n-channel enhancement type MOS field effect transistor hardly turns on around the source of power voltage level Vdd and a p-channel enhancement type MOS field effect transistor tends to remain off around the source of ground voltage level. Namely, the transistor switches associated with the resistive elements in the vicinity of the metal strip 64a for the power voltage level Vdd relay the power voltage level to the associated output lines, and the gate electrodes thereof are driven between the power voltage level Vdd and the ground voltage level. Since those transistor switches are of the n-channel type, the threshold voltage level of the n-channel type field effect transistors is lifted up due to the back-gate biasing effect. In this situation, the transistor switches hardly turn on in the presence of the power voltage level at the gate electrodes thereof. Similarly, if the transistor switches in the vicinity of the metal strip 64b for the ground voltage line are formed of p-channel field effect transistors, the transistor switches hardly turn on in the presence of the ground voltage level at the gate electrodes thereof due to the back-gate biasing effect. However, each of those transistor switches is implemented by only one field effect transistor of either p-channel or n-channel type in view of reduction of the number of the component transistors. On the other hand, the reason why the parallel combinations S2 are provided between the n-channel enhancement type MOS field effect transistors S1 and the p-channel enhancement type field effect transistors S3 is that the combination of the MOS field effect transistors Qn and Qp establishes a highly conductive channel between the common nodes SD3 and SD4 through perfect switching action in so far as the parallel combination is spaced from both of the voltage sources Vdd and GND.

However, the inventors has discovered that the prior art digital-to-analog converter encounters a problem in that the relative accuracy of each resistive element is deteriorated in case that the semiconductor chip 61 is accommodated in a molding package. In detail, the switching network is implemented by the three kinds of switching element as described hereinbefore, and the distance between the adjacent two n-type impurity regions 62a to 62h is dependent on the type of switching element. If the parallel combinations S2 are formed between the adjacent two n-type impurity regions, the distance is larger rather than that for the MOS field effect transistors S1 or S3. The wide distance results in wide portions of the thick field oxide film, and the wide portions of the thick field oxide film is causative of large thermal stress in the high-temperature molding stage. On the other hand, the narrow distance results in narrow portions of the thick field oxide film and, accordingly, in small thermal stress, and irregularity of thermal stress takes place in the semiconductor chip 61. Moreover, the two polysilicon strips are associated with a single row of the parallel combinations S2, but a single row of the MOS field effect transistors S1 or S3 need a single polysilicon strip. Such an irregular pattern of the polysilicon strips promotes the irregularity of the thermal stress. When the n-type impurity regions 62a to 62h are subjected to the irregular thermal stress, the sheet resistance is varied due to the piezoelectric effect, and, for this reason, the relative accuracy of each resistive element is deteriorated. FIG. 7 shows the amount of error contained in the analog output signal fed from the prior art digital-to-analog converting unit to be molded in terms of the value of the 8-bit digital input signal. The axis of ordinates indicates the error in LSB, and the unit LSB for n-bit digital input signal is calculated as (difference voltage between the string of the resistive elements)/ $2^n$. The axis of abscissas indicates the value of the digital input signal in hexadecimal. FIG. 7 teaches us that the error fluctuates more than 1.25 LSB. If the prior art digital-to-analog converting unit fabricated on the semiconductor chip 61 is accommodated in a ceramic package, the fluctuation of the error is decreased to 0.5 LSB as shown in FIG. 8, because the ceramic package is less causative of irregularity of thermal stress.

SUMMARY OF THE INVENTION

It is therefore an important object of the present invention to provide a digital-to-analog converting unit which suppresses the error even if the semiconductor chip is accommodated in a molding package.

To accomplish these objects, the present invention proposes to fabricate a switching array from parallel combination of an n-channel type field effect transistor and a n-channel type field effect transistor selectively used as a switching element depending upon the location thereof.

In accordance with the present invention, there is provided a digital-to-analog converting unit comprising a) a plurality of resistive elements coupled in series between first and second sources of voltage level, every adjacent two resistive elements being coupled through an intermediate node, b) a plurality of switching elements arranged in rows and columns, each switching element being provided in association with the adjacent two resistive elements and having an input node coupled to the intermediate node between the adjacent two resistive elements, an output node, and first and second control nodes, each of the switching elements being implemented by a parallel combination of an n-channel type field effect transistor with the first control node and a p-channel type field effect transistor with the second control node, c) a plurality of first input signal lines respectively associated with the rows and propagating component bits of a digital input signal, respectively, each of the switching elements of each row being coupled at the first control node thereof to the associated first input signal line, d) a plurality of second input signal lines respectively paired with the plurality of first input signal lines and propagating the complementary bits of the component bits, respectively, each of the switching elements of each row being coupled at the second control node thereof to the associated second input signal line, and e) a plurality of output signal lines provided in associated with the columns, each of the switching elements of each column being coupled at the output node thereof to the associated output signal line.

BRIEF DESCRIPTION OF THE DRAWINGS

The features and advantages of a digital-to-analog converting unit according to the present invention will be more clearly understood from the following description taken in conjunction with the accompanying drawings in which:

FIG. 1 is a circuit diagram showing the arrangement of a prior art digital-to-analog converting unit;

FIG. 3 is a view showing an n-channel enhancement type field effect transistor incorporated in the digital-to-analog converting unit shown in FIG. 2;

FIG. 4 is a view showing a parallel combination of an n-channel enhancement type MOS field effect transistor and a p-channel enhancement type MOS field effect transistor used in the digital-to-analog converting unit shown in FIG. 2;

FIG. 5 is a view showing a p-channel enhancement type field effect transistor incorporated in the digital-to-analog converting unit shown in FIG. 2;

DESCRIPTION OF THE PREFERRED EMBODIMENTS

Figure 14:
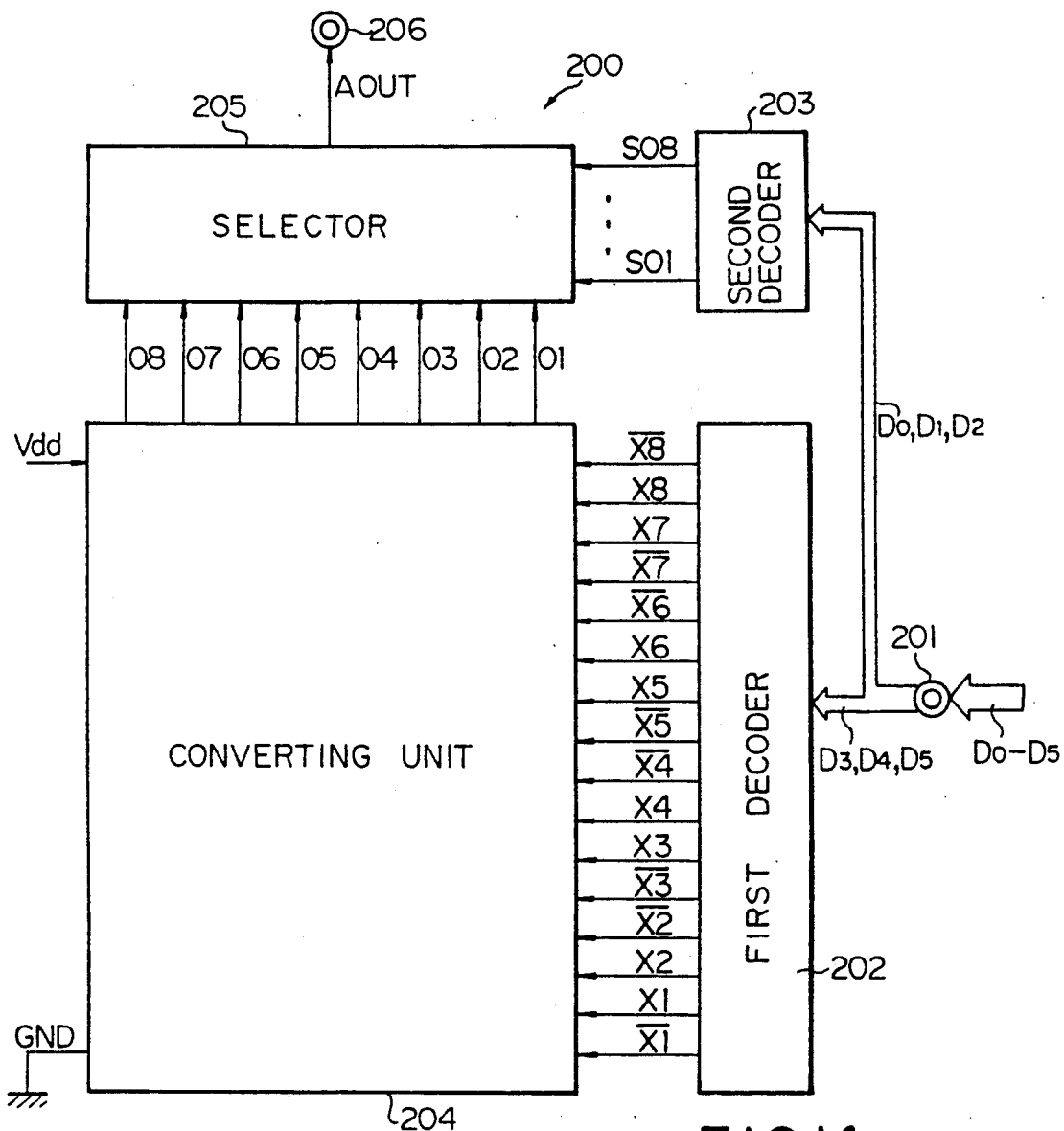
FIG. 14 is a block diagram representative of the digital-to-analog converter of the embodiment according to the present invention.

Referring first to FIG. 14 of the drawings, a digital-to-analog converter 200 embodying the present invention is of the six-bit converter. A six-bit digital data D0 to D5 is supplied to the input terminals 201 and converted into an analog output signal. The high-order 3 bits D3, D4 and D5 are supplied to a first decoder 202, and the bit D5 is the most significant bit. The lower three-bits D0, D1 and D2 are supplied to a second decoder 203, and the bit D0 is the least significant bit. The first decoder 202 is operative to decode the three bits D3 to D5, and drives one of the decoded lines X1 to X8 to an active high voltage level depending upon the value represented by the three bits D3 to D5. In this instance, the active high voltage level means a power voltage level Vdd. If the three bits D3, D4 and D5 are (0,0,0), the decoded line X1 is driven to the active high level. However, the decoded line X8 goes up to the active high level in the presence of the bits D3, D4 and D5 of (1,1,1). Non-selected decoded lines remains in a low level or the ground voltage level. Decode lines $\overline{X1}$ to $\overline{X8}$ propagate respective complementary levels of the decoded lines X1 to X8. The decoded lines X1 to X8 and the complementary decoded lines $\overline{X1}$ to $\overline{X8}$ are coupled to a converting unit 204, and the converting unit 204 provides analog output signals on output signal lines O1 to O8. The analog output signals on the output signal lines O1 to O8 are weighted by a predetermined factor and correspond to pieces of information representative of the combination of the bits D3 to D5. The lower three bits D0 to D2 are fed to the second decoder 203 as described hereinbefore, and the second decoder 203 selectively drives control lines S01 to S08. Namely, one of the control lines S01 to S08 is driven to the active high level. If the lower bits D0 to D2 are, by way of example, (0,0,0), only the control line S01 goes up to the active high level. The lower bits D0 to D2 results in the control line S08 of the active high level. The control lines S01 to S08 are respectively associated with the analog output signal lines O1 to O8, and allow the associated analog output signal lines O1 to O8 to couple an output terminal 206. If the control line S01 is driven to the active high level, the analog output signal line O1 is coupled to the output terminal 206. In short, the digital-to-analog converter according to the present invention produces a plurality of analog output signals corresponding to the high order three bits D3 to D6 on the analog output signal lines O1 to O8, and selects one of the analog output signal lines O1 to O8 in response to the low order three bits D0 to D2.

Figure 9:
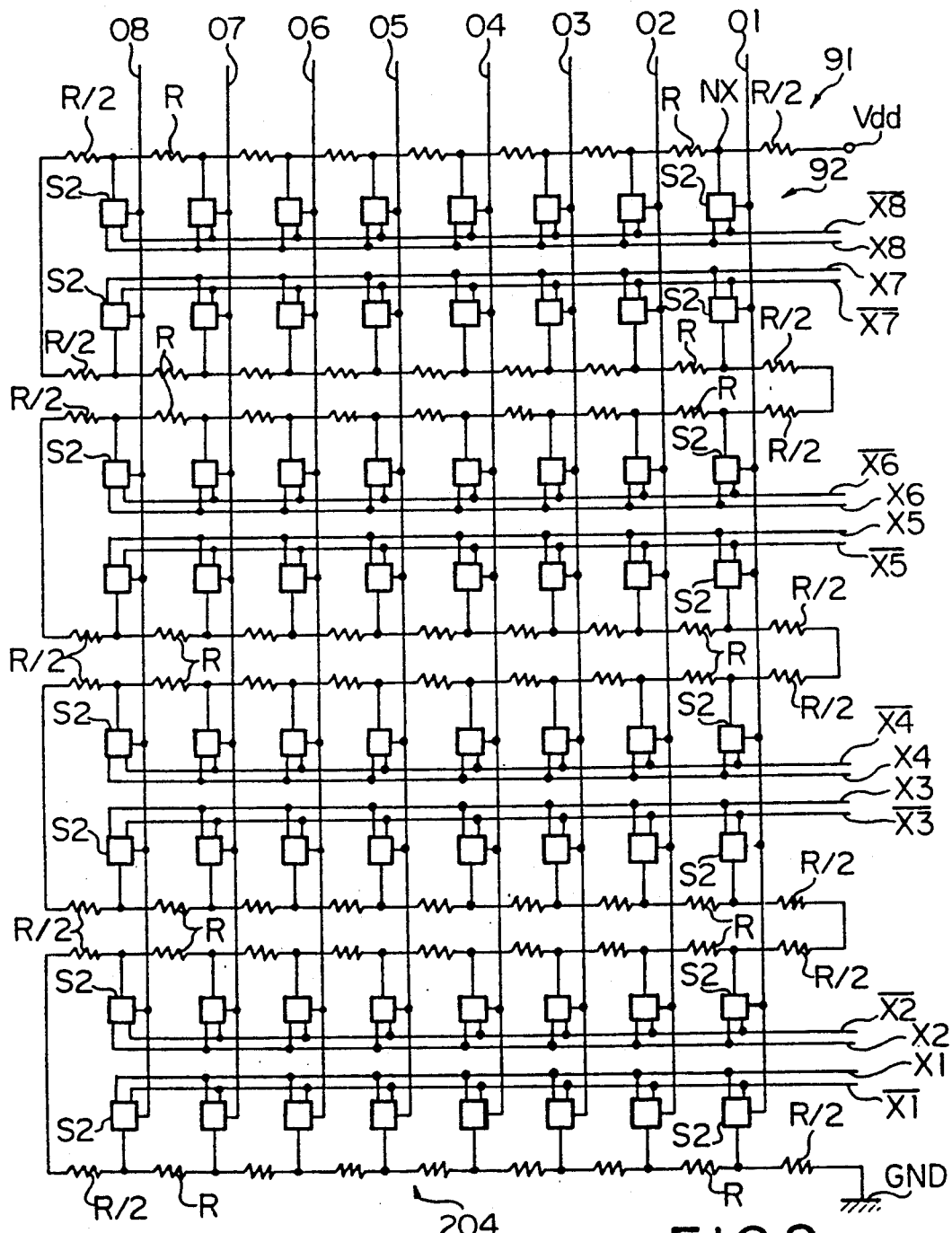
FIG. 9 is a circuit diagram showing the arrangement of a part of a digital-to-analog converter of the first embodiment according to the present invention.

Turning to FIG. 9 of the drawings, the converting unit 204 shown in FIG. 14 comprises a resistor string 91 of resistive elements R and R/2 and an array 92 of switching elements each represented by a small box. The string 91 of the resistive elements R and R/2 is coupled between a first power terminal supplied with a power voltage Vdd and a second power terminal supplied with a ground voltage level GND, and the switching elements are arranged in rows and columns. Each of the resistive elements R is twice as large in resistance as each resistive element R/2. Although any mark is labeled to the resistive elements between resistive elements R, each of those resistive elements has the unit resistance R. The reason why two resistive elements R/2 are coupled at every turn of the string 91 is that the series combination of the resistive elements R/2 can eliminate irregularity due to the bend of the string 91. In accordance with the present invention, all of the switching elements are implemented by the parallel combination S2 shown in FIG. 4 and thus composed of both of an n-channel enhancement type field effect transistor Qn and a p-channel type field effect transistor Qp. The common node SD3 of each parallel combination switch S2 is coupled to an associated node between two adjacent resistive elements of the string 91, and the columns of the parallel combination switches S2 are coupled at the common nodes SD4 to output signal lines O1 to O8, respectively.

The decoded lines X1 to X8 and $\overline{X1}$ to $\overline{X8}$ from the first decoder 202 (see FIG. 14) are connected to the rows of the parallel combination switches S2, respectively, as shown in the drawings. In particular, the decoded signal line $\overline{Xn}$ (where n is one to eight) is coupled to the gate electrodes of the n-channel enhancement type field effect transistors in the associated row of the switching elements S2, and the complementary decoded line $\overline{Xn}$ (where n is also one to eight) is shared between the p-channel enhancement type field effect transistors of the associated row of the switching elements S2. In operation, if the input digital data (D0, D1, D2, D3, D4, D5 has the bit string of (100001), the decoded line X5 is driven to the active high level corresponding to logic "1" level, and, accordingly, the complementary decoded line $\overline{X5}$ goes down to the inactive low level corresponding to logic "0" level. The other decoded lines $\overline{X1}$ to $\overline{X4}$ and $\overline{X6}$ to $\overline{X8}$ remains in the low level, and the complementary decoded lines X1 to X4 and X6 to X8 are in the high level. In this situation, only the eight switching elements of the fifth row from the bottom of the FIG. 9 turn on, and the voltage levels of the associated resistive elements are relayed to the output signal lines O1 to O8, respectively. Since the bits D0 to D2 are (100), the control line S02 of FIG. 14 is driven to the high level, and the selector 205 transfers the analog voltage level on the output signal line O2 to the output terminal 206 as an analog output signal corresponding to the digital input signal of (100001). The converting unit 204 similarly behaves in the presence of the digital input signal with another bit string.

As already described hereinbefore, an n-channel enhancement type field effect transistor hardly turns on in the vicinity of the source of power voltage vdd and a p-channel enhancement type field effect transistor tends to remain off around the ground node GND at all times. Nevertheless, even if all of the switching elements are of the parallel combination switch S2 and thus including both of the n-channel enhancement type field effect transistor Qn and the p-channel enhancement type field effect transistor Qp. The advantages of this construction will be described hereinbelow.

Figure 10A:
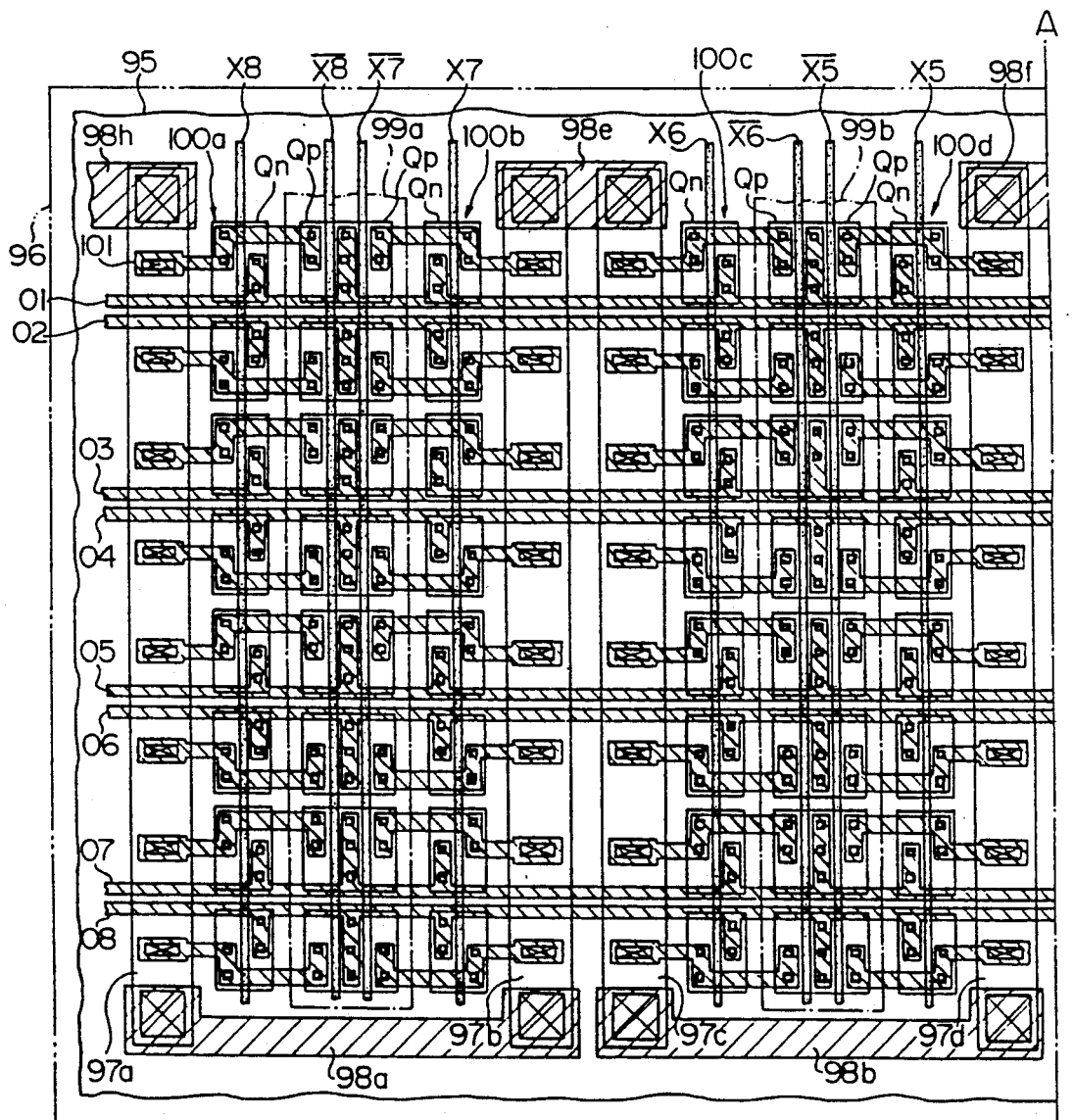
FIG. 10A and 10B are views showing the layout of an integrated circuit chip for fabricating the digital-to-analog converting unit shown in FIG. 9 in a composite manner.
Figure 10B:
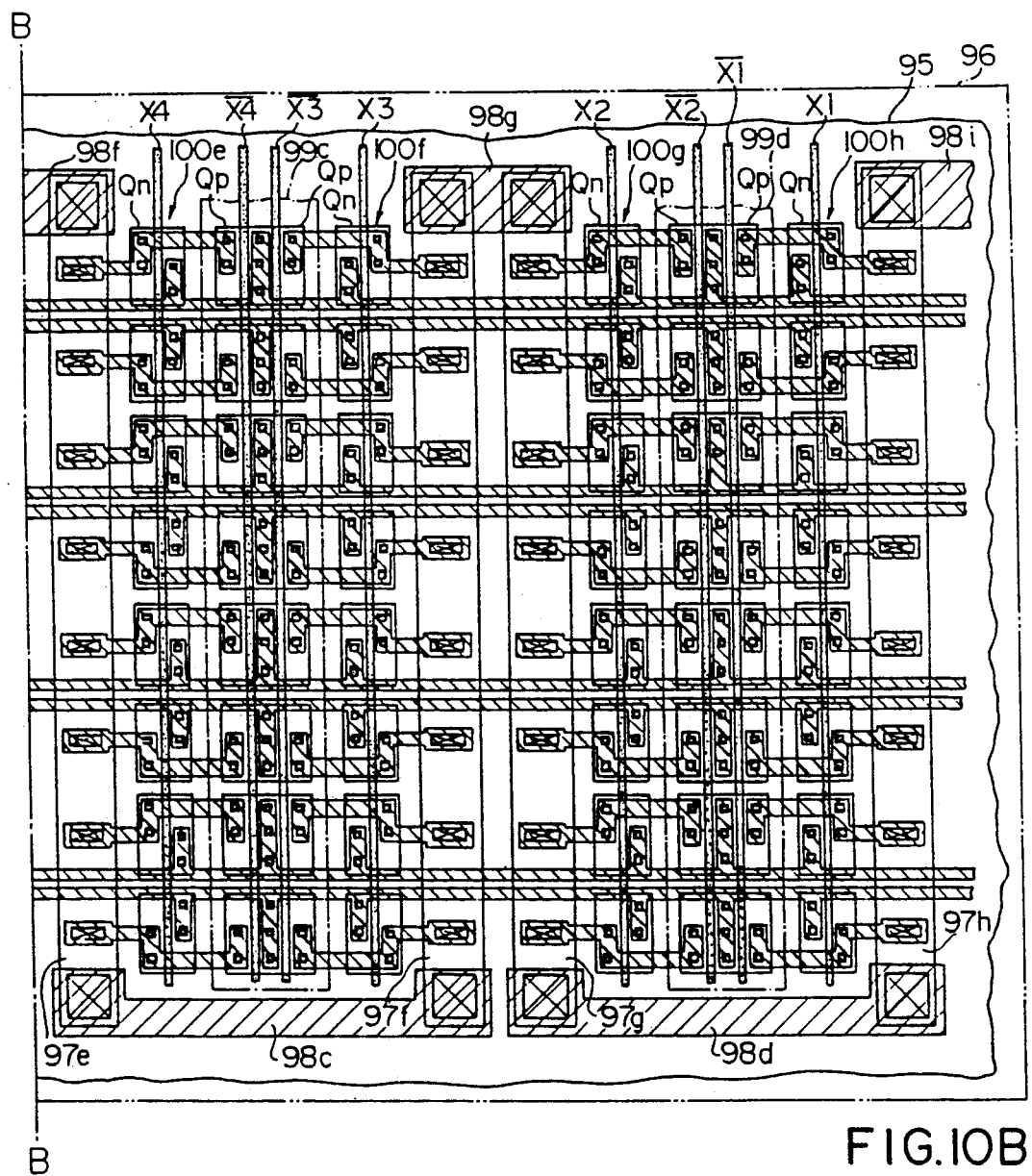

The string 91 and the array 92 are fabricated on a single p-type semiconductor chip 95 shown in FIGS. 10A and 10B. Although the semiconductor chip 95 is divided into two pieces for the sake of easy drafting, line A—A of FIG. 10A is merged into line B—B of FIG. 10B, and the actual semiconductor chip 95 forms a single piece. The semiconductor chip 96 is sealed in, for example, a molded plastic 96. Since FIGS. 10A and 10B are of the composite drawings, the string 91 of the resistive elements and the array 92 of the switching elements formed into a multilevel structure are drafted with real lines, and contact holes for interconnections between different levels are represented by boxes with X and small black areas. The layout shown in FIGS. 10A and 10B is turned at 90 degrees with respect to the arrangement shown in FIG. 9, and, for this reason, term "row" is used in the following description instead of term "column" used hereinbefore.

In the semiconductor chip 95 are formed a plurality of n-type impurity regions 97a, 97b, 97c, 97d, 97e, 97f, 97g and 97h arranged in parallel which are coupled by long metal strips 98a, 98b, 98c and 98d as well as by short metal strips 98e, 98f and 98g. The impurity regions 97a to 97h, the long metal strips 98a to 98d and the short metal strips 98e to 98g form in combination the string 91 of the resistive elements. A metal strips 98h supplies one end of the string 91 of the resistive elements with the power voltage level Vdd, and the ground voltage level is supplied from a metal strip 98i to the opposite end thereof. The long metal strips 98a to 98c are approximately equal in length to one another, and the short metal strips 98e to 98g are also adjusted to a predetermined length. This is because of the fact that each area between two of the n-type impurity regions 97a to 97h allows a single n-type well 99a, 99b or 99c and two pairs of columns of n-type impurity regions 100a and 100b, 100c and 100d, 100e and 100f, or 100g and 100h to be formed therein. In each of the n-type wells 99a to 99d, three columns of p-channel enhancement type impurity regions are formed for providing source/drain regions of the p-channel type field effect transistors Qp. On the other hand, each pair of columns of the n-type impurity regions provides source/drain regions of n-channel enhancement type field effect transistors arranged in a single column, and every n-channel enhancement type field effect transistor Qn is paired with every p-channel enhancement type field effect transistor Qp for forming in combination one of the parallel combinations S2. The n-type impurity regions 97a to 97h are concurrently formed together with the n-type impurity regions 100a to 100h, and, for this reason, the sheet resistance of the n-type impurity regions 97a to 97h is substantially uniform.

A plurality of intermediate nodes are each provided between two adjacent resistive elements of the string 91, and the intermediate nodes are located in such a manner that the resistive elements R and R/2 are formed in each of the n-type impurity regions 100a to 100h in a predetermined pattern. A conductive strip 101 interconnects the associated intermediate node and the common node of the parallel combination S2, and polysilicon strips or the output signal lines O1 to O8 are coupled to the opposite common nodes of the parallel combinations S2 of the respective rows. The input signal lines X1 to X8 are implemented by polysilicon strips also labeled with X1 to X8, and the polysilicon strips X1 to X8 provide the gate electrodes of the n-channel enhancement type field effect transistors Qn. Similarly, the input signal lines CX1 to CX8 are formed by polysilicon strips which provide the gate electrodes of the p-channel enhancement type field effect transistors Qp.

Figure 11:
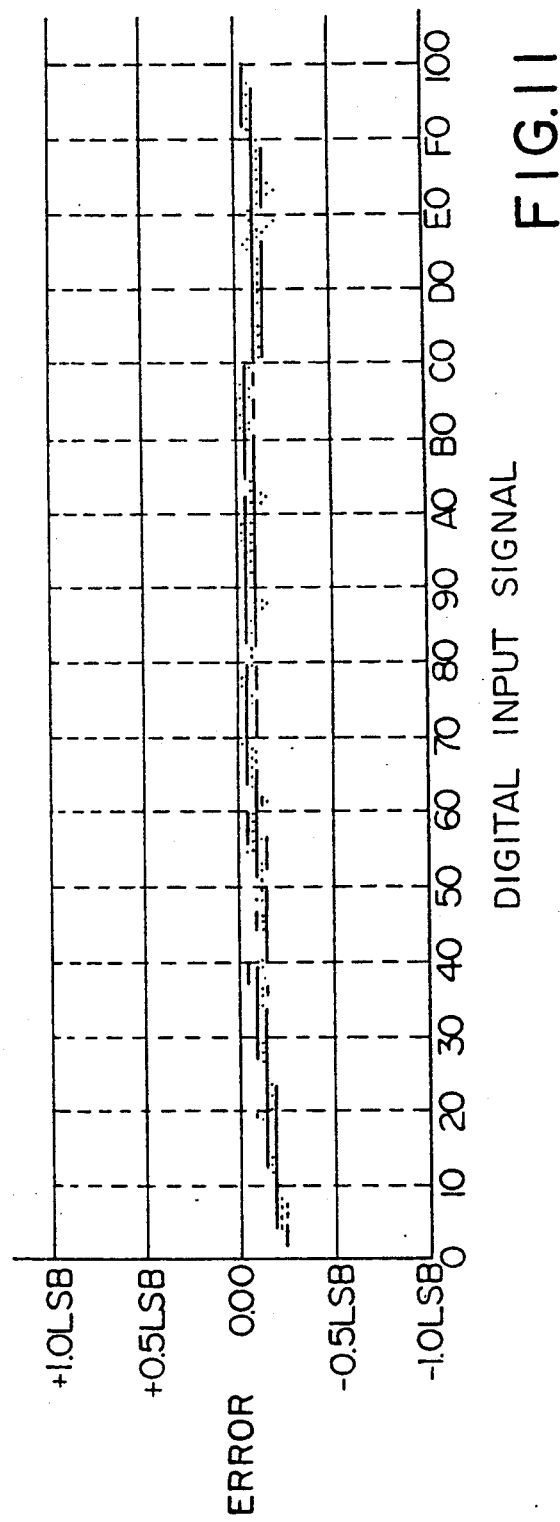
FIG. 11 is a graph showing the error contained in the analog output signal with respect to the value of the digital input signal supplied to the digital-to-analog converting unit shown in FIGS. 9, 10A and 10B.

As apparent from FIG. 9, since all of the witches S2 includes both of the n-channel type field effect transistor Qn and the p-channel type field effect transistor Qp, the impurity regions 100a to 100h, the n-type wells 99a to 99d and the polysilicon strips X1 to X8, CX1 to CX8 and O1 to O8 are regularly repeated in a pattern. This results in that irregularity of thermal stress are eliminated from the semiconductor chip, and the regularity improves the accuracy of each resistive element. In fact, the error contained in the analog output signal is fallen with 0.25 LSB as shown in FIG. 11.

Figure 2:
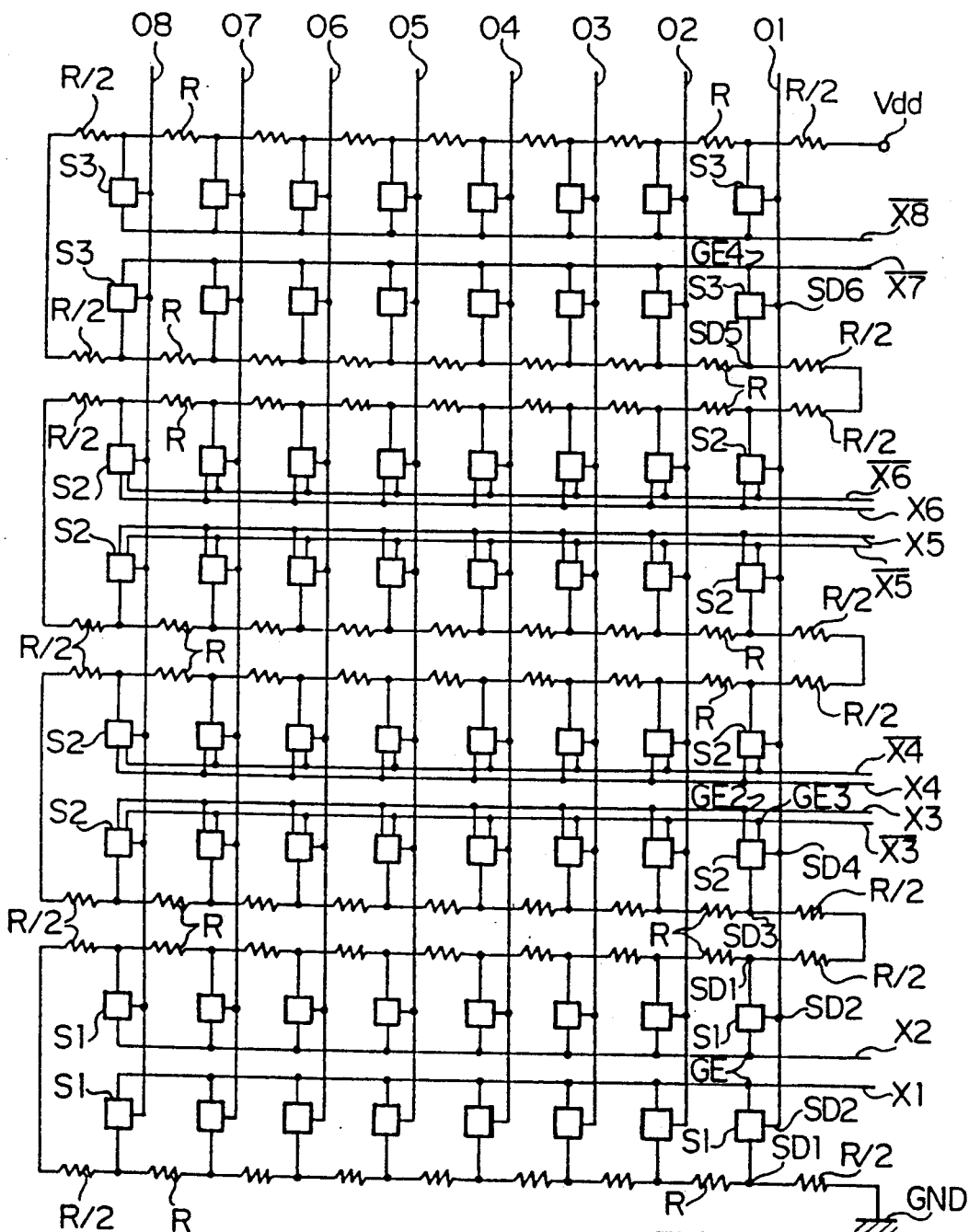
FIG. 2 is a circuit diagram showing the arrangement of a prior art digital-to-analog converting unit.
Figure 6:
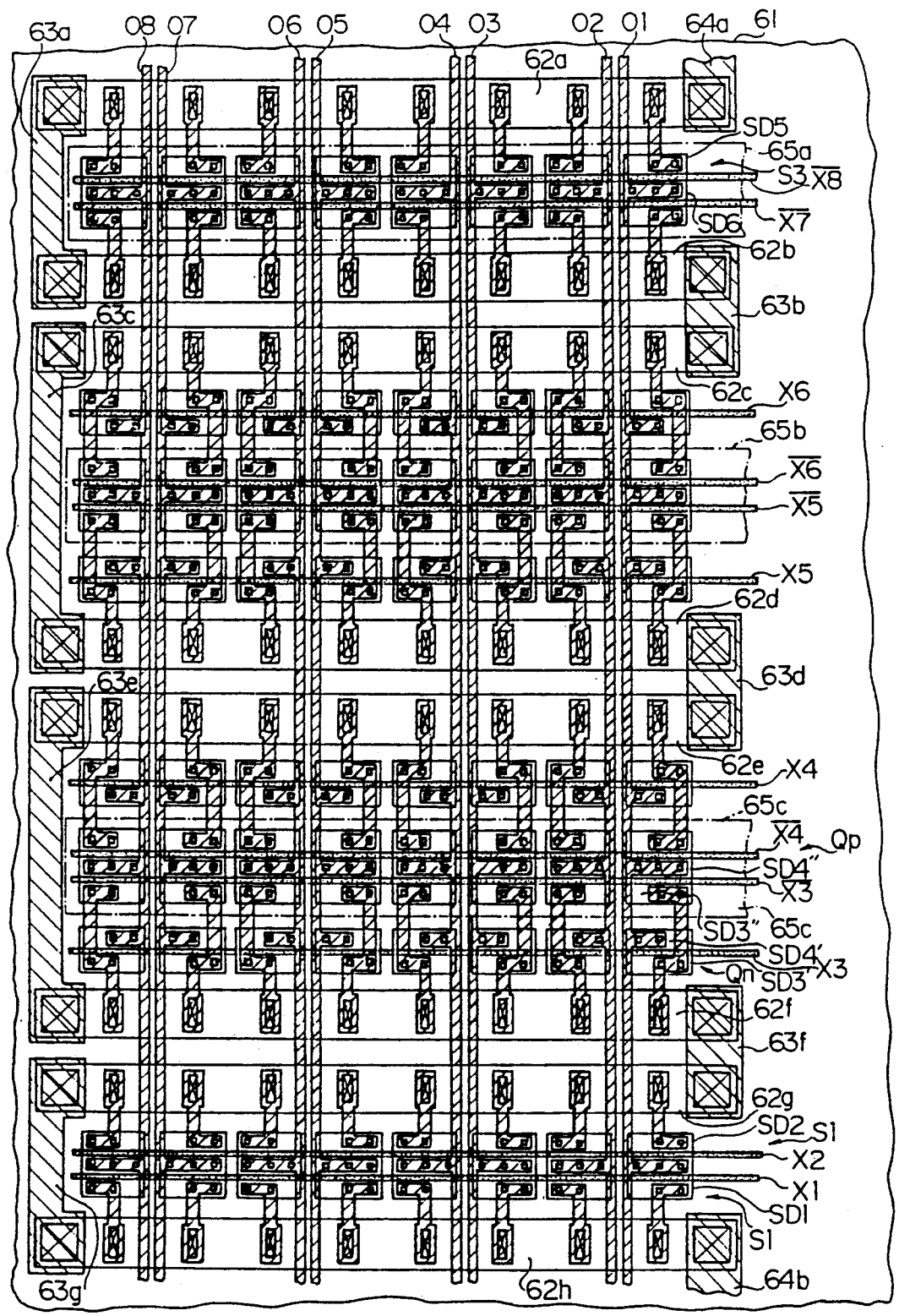
FIG. 6 is a view showing, in a composite manner, the layout of the prior art digital-to-analog converting unit fabricated on a semiconductor chip.
Figure 7:
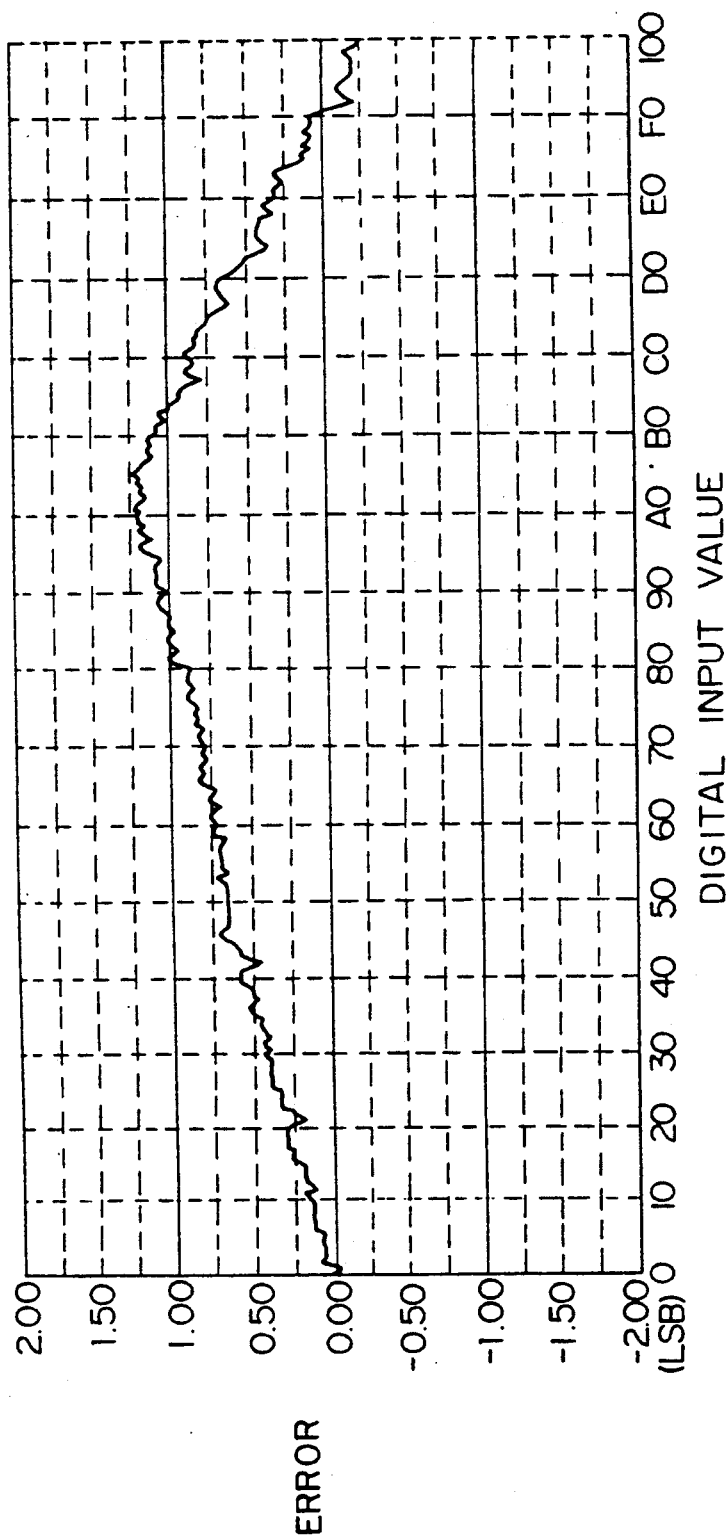
FIG. 7 is a graph showing the error contained in the analog output signal with respect to the value of the 8-bit digital input signal supplied to the prior art digital-to-analog converting unit accommodated in a molding package.
Figure 8:
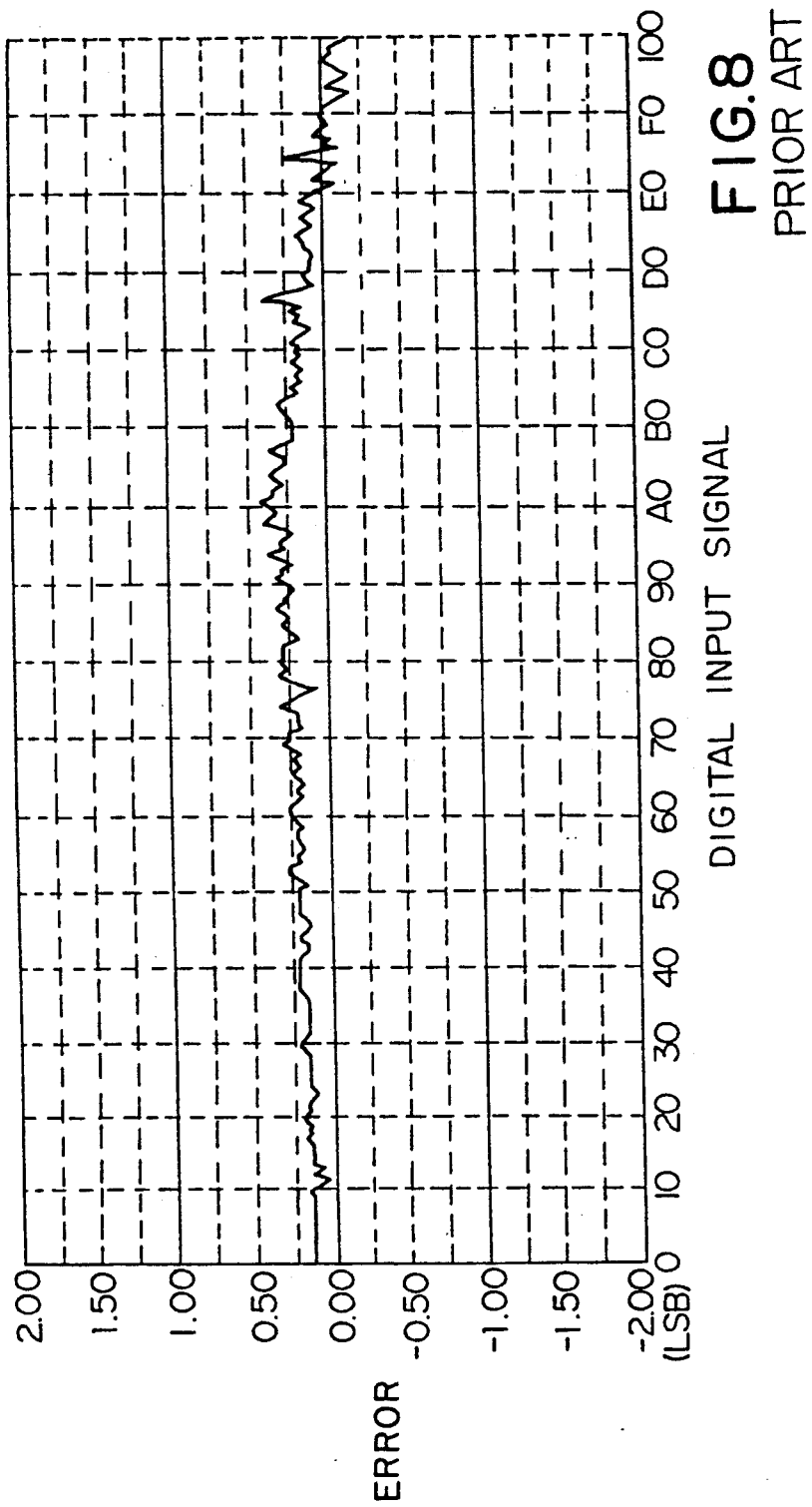
FIG. 8 is a graph showing the error contained in the analog output signal with respect to the value of the 8-bit digital input signal supplied to the prior art digital-to-analog converting unit accommodated in a ceramic package.
Figure 12:
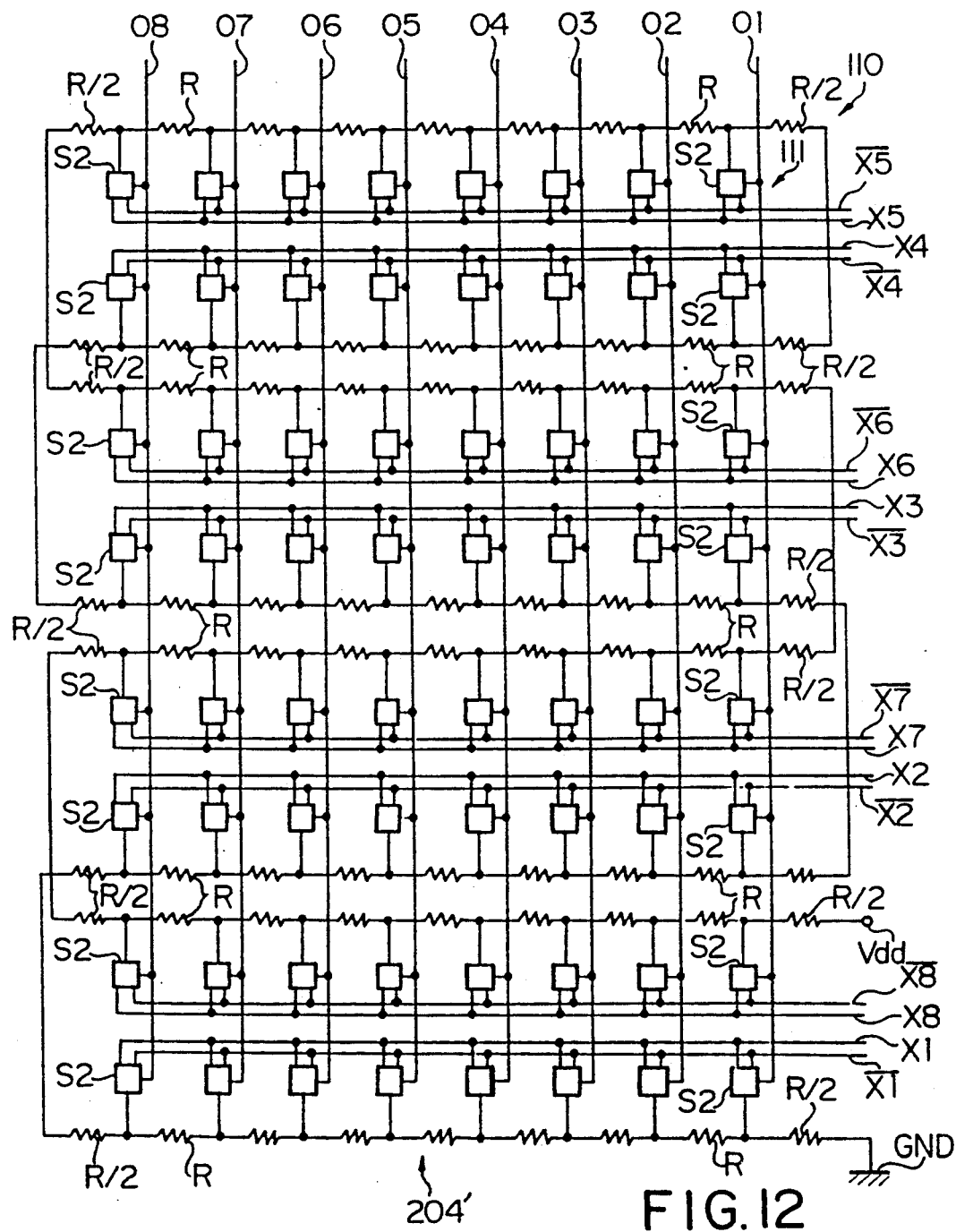
FIG. 12 is a circuit diagram showing the arrangement of a part of another digital-to-analog converter of a second embodiment according to the present invention.

Turning to FIG. 12 of the drawings, another converting unit 204' embodying the present invention largely comprises a string 110 of resistive elements R and R/2 and an array 111 of the switching elements, and all of the resistive elements are also implemented by the parallel combination switch S2. This unit is different in connection of the resistive elements R and R/2 from that shown in FIG. 9. Namely, the lowest two rows of the switching elements are associated to the rows of resistive elements coupled to a power of power voltage level Vdd and a ground node, respectively. Further, the connecting relationship between the respective ones of the decoded lines X1 to X8 and X1 to X8 and the corresponding ones of the rows of the switches S2 is different from that of FIG. 2 as shown in FIG. 9.

Figure 13A:
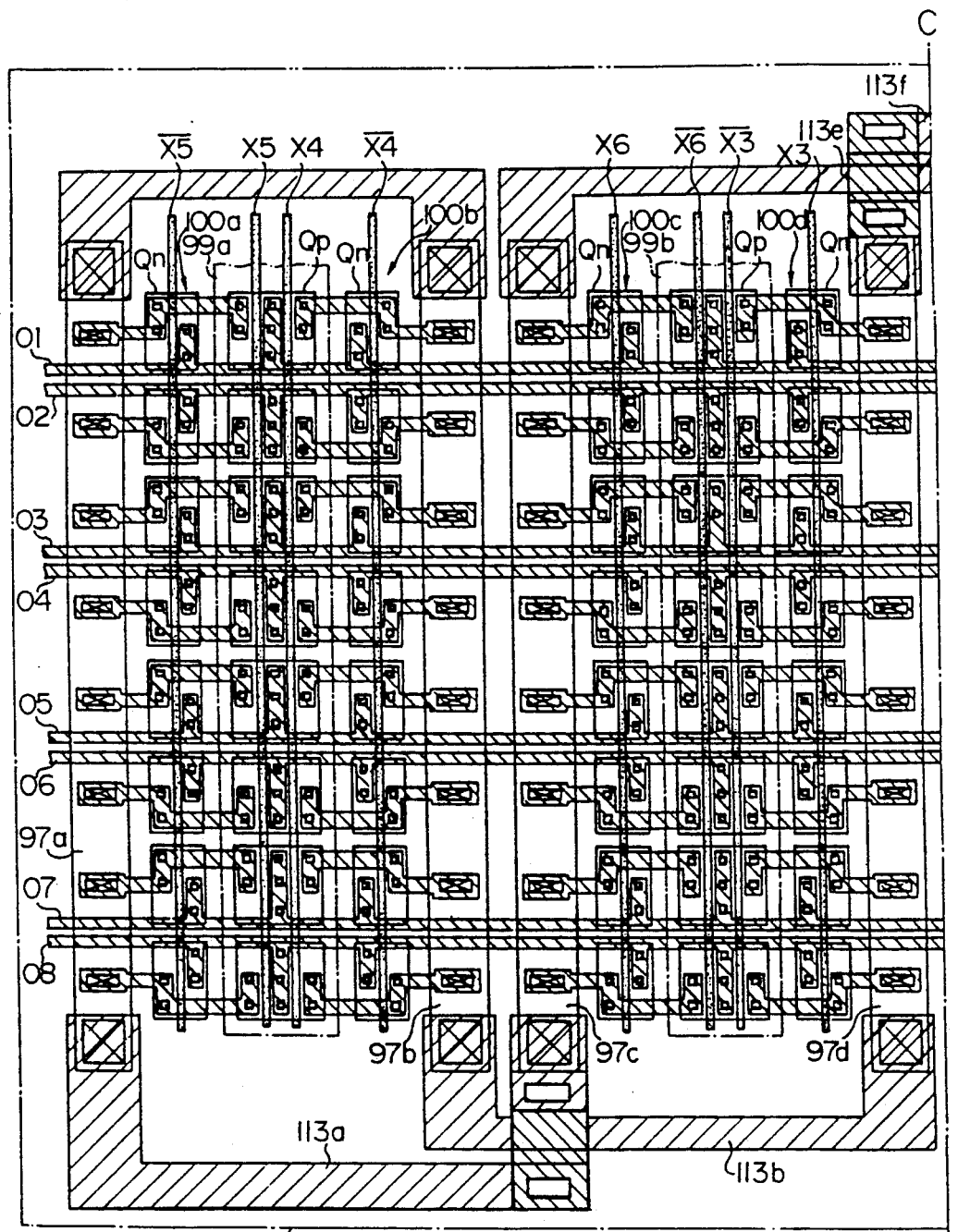
FIGS. 13A and 13B are views showing the layout of an integrated chip for fabricating the digital-to-analog converting unit shown in FIG. 12 in a composite manner.
Figure 13B:
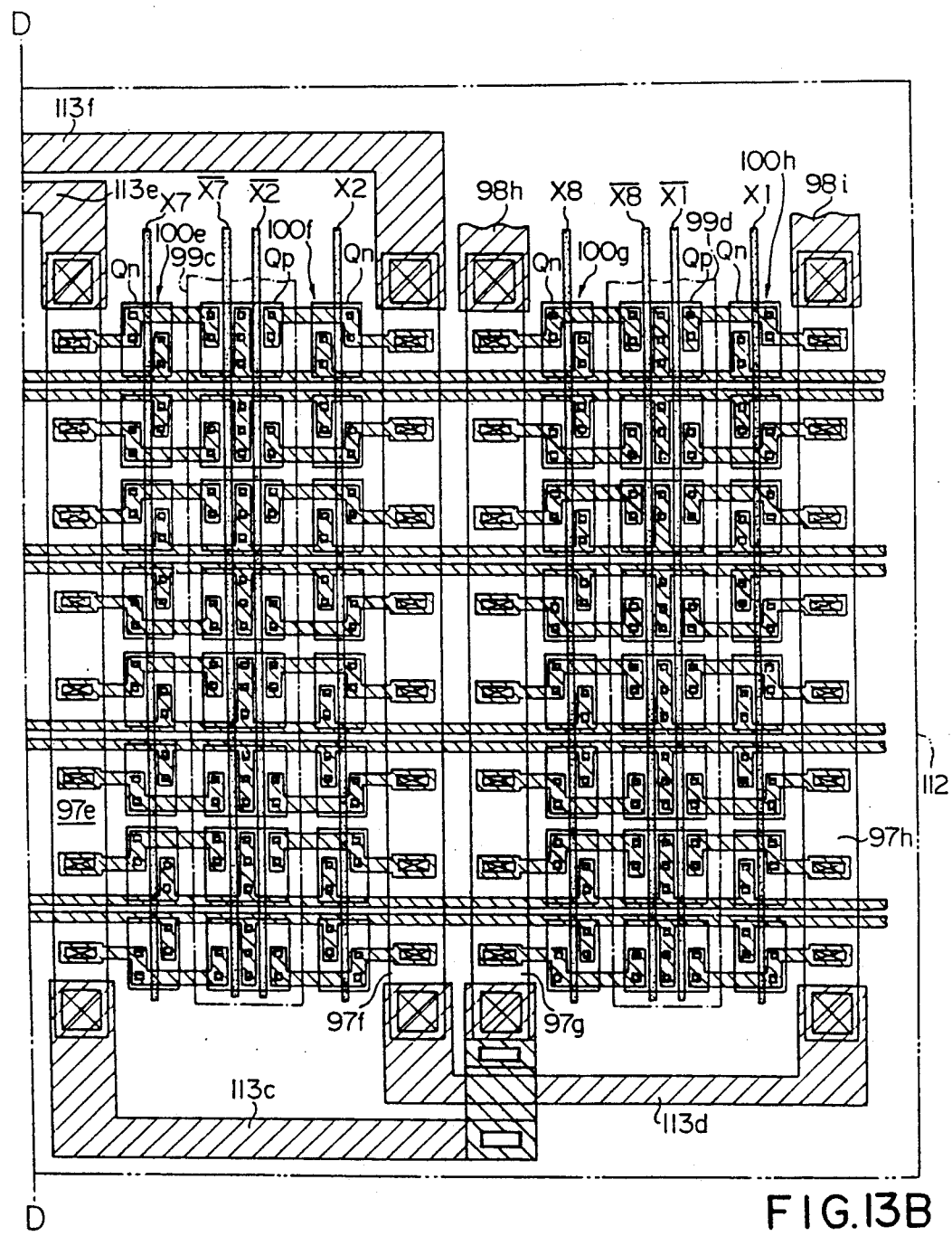

The converting unit 204' is also fabricated on a single semiconductor chip 112, and the layout thereof is illustrated in FIGS. 13A and 13B in a composite manner. If line C—C of FIG. 13A is merged with line D—D of FIG. 13B, the layout of the digital-to-analog converting unit is completely drafted. As described hereinbefore, only the connection of the resistive elements R and R/2 is different from that of the first embodiment, and, for this reason, regions and strips corresponding to those of the first embodiment are labeled with the same reference marks without description. The connection of the resistive elements R and R/2 is achieved by conductive strips 113a to 113f.

Since the area between the n-type impurity regions 97a and 97b is as wide as another area between every two adjacent n-type impurity regions 97c and 97d, 97e and 97f, or 97g and 97h, irregularity of thermal stress is decreased and the relative accuracy of each resistive element is improved.

Although particular embodiments of the present invention have been shown and described, it will be obvious to those skilled in the art that various changes and modifications may be made without departing from the spirit and scope of the present invention. For example, the p-channel type field effect transistors of the parallel combination switches in the vicinity of the ground terminal as well as the n-channel type field effect transistors of the parallel combination switches adjacent to the power voltage terminal Vdd hardly turn on as described hereinbefore, and, for this reason, the associated decoded lines and the associated complementary decoded lines may be kept in the inactive levels. In this implementation, those field effect transistors kept in the off-state may be called as "dummy transistor".

What is claimed is:

1. A digital-to-analog converting unit comprising:
  a) a plurality of resistive elements coupled in series between first and second sources of voltage level, every adjacent two resistive elements being coupled through an intermediate node;
  b) a plurality of switching elements arranged in rows and columns, each switching element being provided in association with said adjacent two resistive elements and having an input node coupled to the intermediate node between said adjacent two resistive elements, an output node, and first and second control nodes every switching element being implemented by a parallel combination of an n-channel type field effect transistor with said first control node and a p-channel type field effect transistor with said second control node so that said plurality of switching elements are formed by a plurality of n-channel type field effect transistors and a plurality of p-channel type field effect transistors respectively paired with said plurality of n-channel type field effect transistors;
  c) a plurality of first input signal lines respectively associated with said rows and propagating component bits of a digital input signal, respectively, each of said switching elements of each row being coupled at said first control node thereof to an associated first input signal line, said n-channel type field effect transistors located in the vicinity of one of said first and second sources of voltage level remaining off at all times even if at least the associated first input signal line is shifted to an active level;
  d) a plurality of second input signal lines respectively paired with said plurality of first input signal lines and propagating the complementary bits of said component bits, respectively, each of said switching elements of each row being coupled at said second control node thereof to an associated second input signal line, said p-channel type field effect transistors located in the vicinity of the other of said first and second sources of voltage level remaining off at all times even if at least the associated second input signal line is shifted to an active level; and
  e) a plurality of output signal lines provided in said columns, each of said switching elements of each column being coupled at said output node thereof to an associated output signal line.

2. A digital-to-analog converting unit as set forth in claim 1, in which said digital-to-analog converting unit is fabricated on a single semiconductor chip.

3. A digital-to-analog converting unit as set forth in claim 2, in which said semiconductor chip is accommodated in a molding package.

4. A digital-to-analog converting unit as set forth in claim 3, in which said string is implemented by impurity regions formed in said semiconductor chip.

5. A digital-to-analog converting unit as set forth in claim 4, in which said first input signal lines are driven to a voltage level approximately equal to said first source of voltage level, and in which said second input signal lines are driven to a voltage level approximately equal to said second source of voltage level.

6. A digital-to-analog converting unit as set forth in claim 4, in which the resistance of each of said resistive elements at both sides of each impurity region is approximately half of that of each resistive element therebetween, and in which every two impurity regions are coupled through a conducive strip extending over said semiconductor chip.

7. A digital-to-analog converting unit comprising a plurality of resistive elements arranged in rows, a plurality of interconnections each interconnecting adjacent two of said rows at either side thereof for forming a series combination of said resistive elements coupled between first and second sources of power voltage level, and switching arrays arranged along said rows of said resistive elements and having a plurality of semiconductor switches coupled in parallel to said series combination of said resistive elements for transferring voltage levels to output signal lines, wherein every semiconductor switch has a p-channel type field effect transistor and an n-channel type field effect transistor coupled in parallel, and wherein said p-channel field effect transistor of each of said semiconductor switches in at least one switching array is a dummy element remaining off at all times and said n-channel field effect transistor of each of said semiconductor switches in at least another switching array is a dummy element remaining off at all times.

* * * * *